United States Patent
Kim et al.

(10) Patent No.: US 9,496,051 B2
(45) Date of Patent: Nov. 15, 2016

(54) EFFICIENT RAID TECHNIQUE FOR RELIABLE SSD

(71) Applicant: TLI INC., Seongnam-si, Gyeonggi-do (KR)

(72) Inventors: Jae Ho Kim, Seoul (KR); Jong Min Lee, Seoul (KR); Jong Moo Choi, Yongin-si (KR); Dong Hee Lee, Seoul (KR); Sam Hyuk Noh, Seoul (KR)

(73) Assignee: TLI INC., Seongnam-si (KR)

( * ) Notice: Subject to any disclaimer, the term of this patent is extended or adjusted under 35 U.S.C. 154(b) by 175 days.

(21) Appl. No.: 14/377,159

(22) PCT Filed: Feb. 8, 2013

(86) PCT No.: PCT/KR2013/001029
§ 371 (c)(1),
(2) Date: Aug. 6, 2014

(87) PCT Pub. No.: WO2013/119074
PCT Pub. Date: Aug. 15, 2013

(65) Prior Publication Data
US 2014/0380092 A1 Dec. 25, 2014

(30) Foreign Application Priority Data

Feb. 9, 2012 (KR) .................. 10-2012-0013076
Feb. 7, 2013 (KR) .................. 10-2013-0013954

(51) Int. Cl.
*G11C 29/04* (2006.01)
*G06F 11/10* (2006.01)
(Continued)

(52) U.S. Cl.
CPC .............. *G11C 29/04* (2013.01); *G06F 3/06* (2013.01); *G06F 3/0613* (2013.01);
(Continued)

(58) Field of Classification Search
CPC .............. G06F 12/0246; G06F 12/0866; G06F 2212/1044; G06F 2212/7201
See application file for complete search history.

(56) References Cited

U.S. PATENT DOCUMENTS 6,467,022 B1   10/2002   Buckland et al.
7,934,055 B2    4/2011   Flynn et al.
(Continued)

OTHER PUBLICATIONS

Im, Soojun et al., "Flash-Aware RAID Techniques for Dependable and High-Performance Flask Memory SSD," IEEE Transactions on Computers Paper No. 0018-9340, vol. 60, No. 1., Jan. 2011, pp. 80-92, 13 pages.
(Continued)

*Primary Examiner* — Jigar Patel
(74) *Attorney, Agent, or Firm* — Alleman Hall McCoy Russell & Tuttle LLP

(57) ABSTRACT

Provided is a control device for managing a plurality of memory channels driven through multichannel interleaving. The apparatus includes a stripe configuring unit for configuring a stripe according to a physical number of pages included in the plurality of memory channels, and a parity generating unit for generating parity data on the configured stripe.

17 Claims, 10 Drawing Sheets

(51) Int. Cl.
*G06F 3/06* (2006.01)
*G06F 12/02* (2006.01)

(52) U.S. Cl.
CPC .......... *G06F 3/0659* (2013.01); *G06F 3/0688* (2013.01); *G06F 11/108* (2013.01); *G06F 12/0246* (2013.01); *G06F 2212/262* (2013.01); *G06F 2212/7208* (2013.01)

(56) References Cited

U.S. PATENT DOCUMENTS

| | | | |
|---|---|---|---|
| 7,941,696 B2 | 5/2011 | Frost et al. | |
| 8,719,621 B1* | 5/2014 | Karmarkar | G06F 11/1076 714/6.1 |
| 2006/0200697 A1* | 9/2006 | Ito | G06F 11/1076 714/6.12 |
| 2008/0250270 A1 | 10/2008 | Bennett | |
| 2010/0131736 A1* | 5/2010 | Lee | G06F 12/0292 711/202 |
| 2011/0041037 A1 | 2/2011 | Frost et al. | |
| 2012/0284587 A1* | 11/2012 | Yu | G06F 3/0608 714/773 |

OTHER PUBLICATIONS

Korean Patent Office, International Search Report of PCT/KR2013/001029, May 30, 2013, WIPO, 12 pages.

* cited by examiner

EFFICIENT RAID TECHNIQUE FOR RELIABLE SSD

CROSS REFERENCE TO RELATED APPLICATIONS

The present application is a U.S. National Phase application of PCT/KR2013/001029, filed on Feb. 8, 2013, which claims priority to Korean Patent Application No. 10-2012-0013076, filed on Feb. 9, 2012, and to Korean Patent Application No. 10-2012-0013954, filed Feb. 7, 2013, the entire contents of each of which are hereby incorporated by reference for all purposes.

TECHNICAL FIELD

The present invention relates to a method and a device for improving reliability of a solid-state drive (SSD), and more particularly, to a method and a device for improving reliability of an SSD by applying a redundant array of independent disks (RAID) technique to the SSD.

BACKGROUND ART

A flash memory based solid-state drive (SSD) may have various merits including low power consumption, high speed, and low weight and thus, may be used as a storage device in a wide range of applications from laptop computers and personal computers to servers and cloud systems.

However, the existing SSD may be less safe, which may result in frequent occurrences of errors in a main component of the SSD, that is, a flash memory. The lower degree of safety may result from limited wear leveling.

Recently, multi level cell (MLC) or a triple level cell (TLC) flash memory capable of storing more than two bits in a cell has been widely adopted and thus, greater consideration is being given to the safety issue. In general, the SSD may write error detection and error correcting codes in an out of band (OOB) area of the flash memory and respond to an unexpected error using the written errors and error correcting codes. However, the SSD may detect and correct only several bit errors occurring during input and output of a single page based on the error detection and correction codes and accordingly, may not be able to detect or respond to errors occurring at the block or chip level.

A related technology may internally apply a redundant array of independent disks (RAID) method to the SSD to improve reliability. However, the RAID method incurs the small write problem issue, which may lower performance and reduce the service lifetime of the flash memory.

Accordingly, there is a desire to design a reliable SSD device in which the small write problem issue is resolved even when using the RAID method.

DISCLOSURE OF INVENTION

Technical Solutions

According to an aspect of the present invention, there is provided a control device for managing multiple memory channels driven through multichannel interleaving.

According to an embodiment, the control device may include a stripe configuring unit to configure a stripe based on a physical page number of pages included in the memory channels, and a parity generating unit to generate parity data with respect to the configured stripe.

When multiple data write requests are sequentially received, the control device may perform the multichannel interleaving to independently perform sequential write operations on a clean page of the memory channels to a logical block address.

The control device may further include a cleaning unit to perform data cleaning on data written on the pages by generating a cleaning block including a stripe and selecting a cleaning block having a fewest number of valid pages as a target block for the data cleaning from among cleaning blocks.

The cleaning unit may copy the target block into at least a portion of blocks of multiple chips associated with the multichannel interleaving, and perform the data cleaning on the target block.

The control device may further include a determining unit to determine whether a first critical time elapses after a most recently requested first page write request is processed.

When the first critical time elapses after the first page write request is processed, the parity generating unit may generate partial parity data with respect to a first physical page number associated with the first page write request.

When the first critical time elapses after the first page write request is processed and a ratio of clean pages to the first physical page number is greater than or equal to a threshold, the parity generating unit may generate the partial parity data.

When a second critical time greater than the first critical time elapses after the first page write request is processed, and the ratio of clean pages to the first physical page number is less than the threshold, the parity generating unit may generate the partial parity data.

The control device may control the multichannel interleaving to allow the generated partial parity data to be written on any one of the clean pages corresponding to the first physical page number.

The control device may allocate at least a portion of blocks of the multiple chips associated with the multichannel interleaving as a partial parity storing area, and control the multichannel interleaving to allow the partial parity data to be written on the partial parity storing area.

According to another aspect of the present invention, there is provided a control device including a determining unit to determine whether a first critical time elapses after a most recently requested first page write request is processed when a page data write operation is processed through multichannel interleaving, and a parity generating unit to generate partial parity data with respect to a first physical page number associated with the first page write request when the first critical time elapses after the first page write request is processed.

When the first critical time elapses after the first page write request is processed and a ratio of clean pages to the first physical page number is greater than or equal to a threshold, the parity generating unit may generate the partial parity data.

When a second critical time greater than the first critical time elapses after the first page write request is processed, and the ratio of clean pages to the first physical page number is less than the threshold, the parity generating unit may also generate the partial parity data.

According to still another aspect of the present invention, there is provided a control method to manage multiple memory channels driven through multichannel interleaving.

According to an embodiment, the control method may include configuring a stripe based on a physical page number of pages included in the memory channels, and generating parity data with respect to the configured stripe.

When multiple page data write requests are sequentially received, the multichannel interleaving may be performed to independently perform sequential write operations on a clean page of the memory channels to a logical block address.

The control method may further include determining whether a first critical time elapses after a most recently requested first page write request is processed. When the first critical time elapses after the first page write request is processed, the generating of the parity data may include generating partial parity data with respect to a first physical page number associated with the first page write request.

When the first critical time elapses after the first page write request is processed and a ratio of clean pages to the first physical page number is greater than or equal to a threshold, the generating of the parity data may include generating the partial parity data. When a second critical time greater than the first critical time elapses after the first page write request is processed, and the ratio of clean pages to the first physical page number is less than the threshold, the generating of the parity data may also include generating the partial parity data.

The control method may include controlling the multichannel interleaving to write the generated partial parity data in any one of clean pages corresponding to the first physical page number.

The control method may include allocating at least a portion of blocks of multiple chips associated with the multichannel interleaving as a partial parity storing area, and control the multichannel interleaving to write the partial parity data in the partial parity storing area.

According to yet another aspect of the present invention, there is provided a control method including determining whether a first critical time elapses after a most recently requested first page write request is processed when a page data write operation is processed through multichannel interleaving, and generating partial parity data with respect to a first physical page number associated with the first page write request when the first critical time elapses after the first page write request is processed.

When the first critical time elapses after the first page write request is processed and a ratio of clean pages to the first physical page number is greater than or equal to a threshold, the generating of the partial parity data may be performed. When a second critical time greater than the first critical time elapses after the first page write request is processed, and the ratio of clean pages to the first physical page number is less than the threshold, the generating of the partial parity data may also be performed.

BEST MODE FOR CARRYING OUT THE INVENTION

Figure 1:
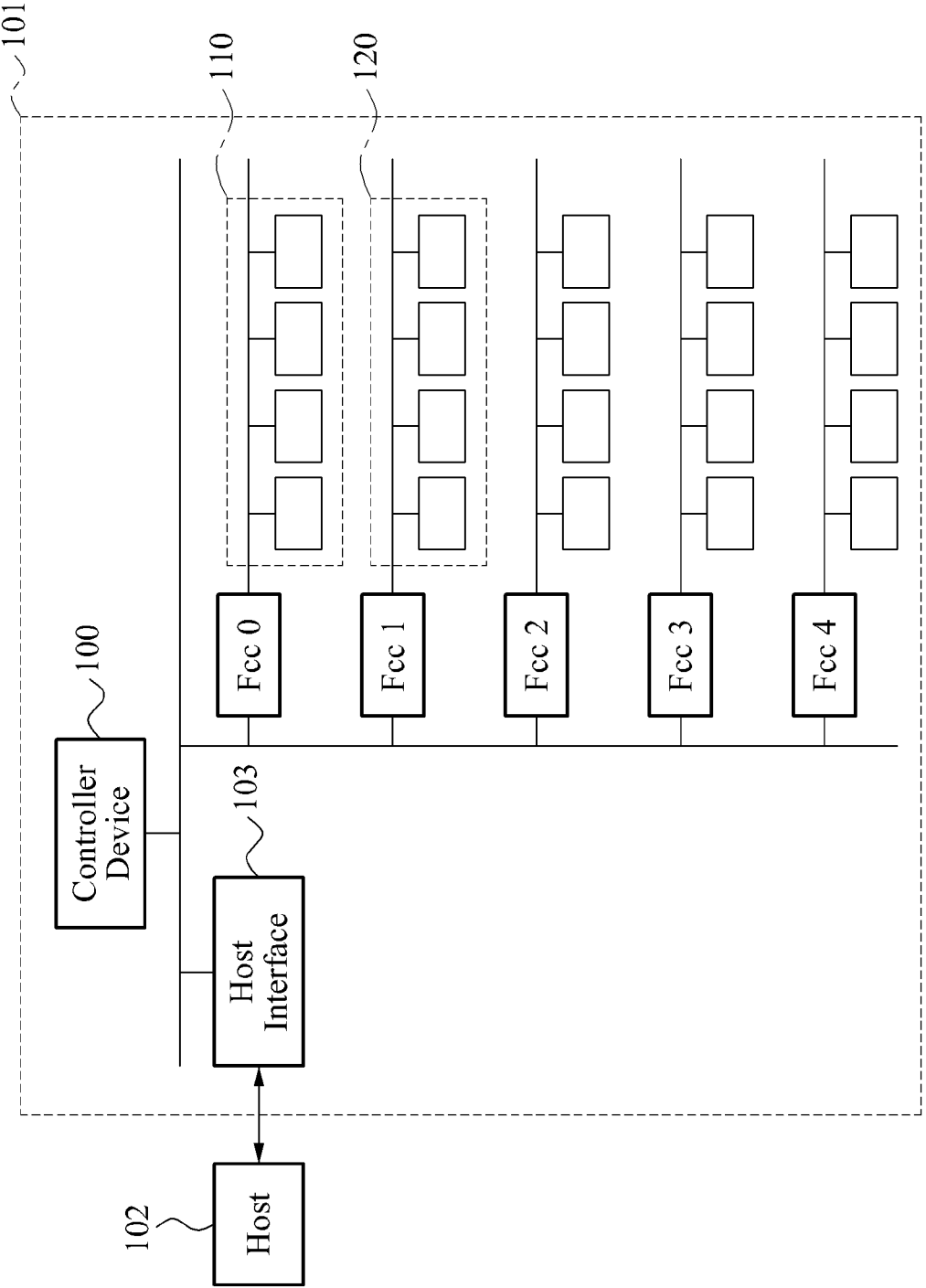
FIG. 1 is a diagram illustrating a configuration of a storage device according to an embodiment of the present invention.

Reference will now be made in detail to embodiments of the present invention, examples of which are illustrated in the accompanying drawings, wherein like reference numerals refer to the like elements throughout. Exemplary embodiments are described below in order to explain the present invention by referring to the accompanying figures, however, the present invention is not limited thereto or restricted thereby.

When it is determined a detailed description related to a related known function or configuration that may make the purpose of the present invention unnecessarily ambiguous in describing the present invention, the detailed description will be omitted here.

Also, terms used herein are defined to appropriately describe the exemplary embodiments of the present invention and thus may be changed depending on a user, the intent of an operator, or a custom. Accordingly, the terms must be defined based on the following overall description of this specification.

A solid-state drive (SSD) may be configured with multiple flash memory chips and input and output channels. Most SSDs may have a redundant array of independent disks (RAID)-0 structure interleaving data for each flash memory chip to operate in parallel so as to improve performance and for each input and output channel to transmit data simultaneously. The RAID may be classified into RAID-0, 1, 2, 3, 4, 5, 6, and the like based on a type, among which the RAID-5 is most widely used.

When the RAID-5 is applied to the SSD, dissimilar to a hard disk drive (HDD), data may not be updated in the original place in a flash memory and be persistently written in another location and thus, frequent data updating may result in increased costs for cleaning the flash memory and a reduced service life. Also, during the data updating, more frequent writing may occur in a chip including the parity and thus, a service life of the chip may be diminished in comparison to other chips.

In related technology, a write request received by the SSD may be provided in a form of a logical block number (LBN). When the LBN is continuous and of a relatively large size, the small write problem issue of the RAID may not occur, but most write requests may be of a relatively small size.

Accordingly, there is provided a data control device and method that may resolve issues described in the foregoing, although the LBN is non-continuous and of a relatively small size. Also, reliability of the storage device, for example, the SSD, may be improved by additionally generating a partial stripe parity, for example, a partial parity.

FIG. 1 is a diagram illustrating a configuration of a storage device 101 according to an embodiment of the present invention. The storage device 101 may include a control device 100, also referred to as a controller device 100 in FIG. 1, a host interface 103, and flash memory chips, for example, 110 and 120.

According to an embodiment, the host interface 103 may provide an interface between the control device 100 controlling the storage device 101 and an external host computer 102, also referred to as a host 102 in FIG. 1. The host interface 103 may refer to a communication protocol, for example, a parallel advanced technology attachment (PATA), a serial ATA, and a universal serial bus (USB). Thus, the storage device 101 may receive a data access command, for example, a data read command and a data write command, from the host 102 through the host interface 103.

The control device 100 may control individual components associated with communication with the host 102 and a flash memory. Also, the storage device 101 may include the flash memory chips 110 and 120 and input and output channels.

In general, an SSD may have a structure in which data is interleaved to allow each of the flash memory chips 110 and 120 to operate in parallel in order to improve performance. Here, each of the input and output channels transmit data simultaneously. The flash memory chips 110 and 120 will be further described hereinafter.

Figure 2:
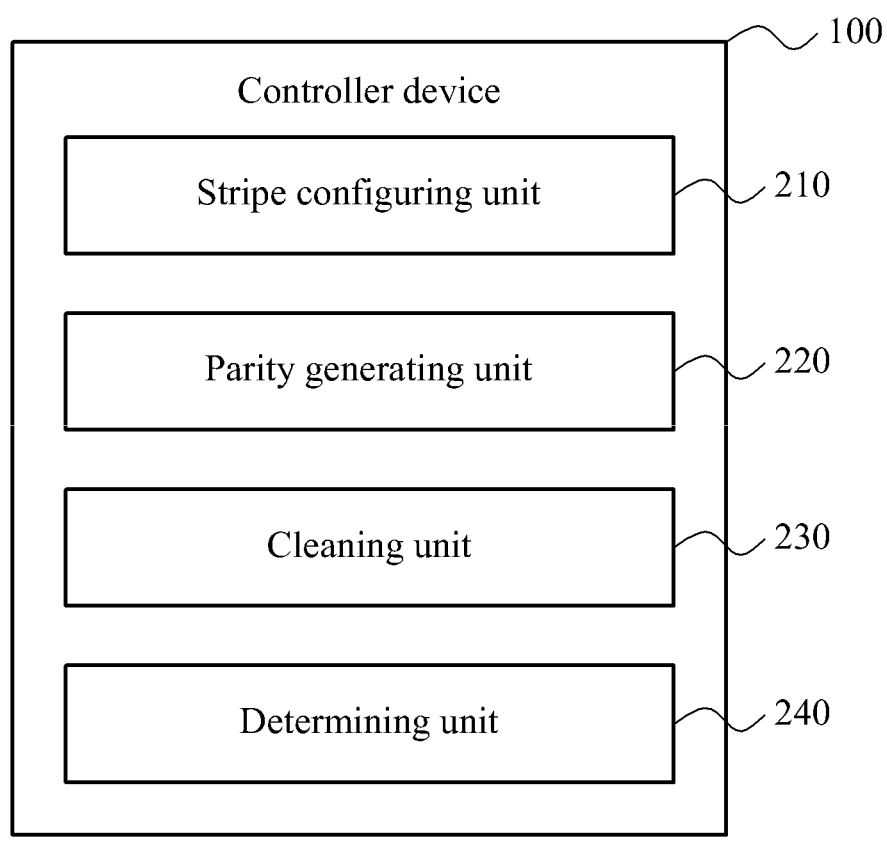
FIG. 2 is a block diagram illustrating a control device according to an embodiment of the present invention.

FIG. 2 is a block diagram illustrating the control device 100, also referred to as the controller device 100 in FIG. 2, according to an embodiment of the present invention. The control device 100 may control multiple memory channels driven through multichannel interleaving.

Referring to FIG. 2, the control device 100 may include a stripe configuring unit 210, a parity generating unit 220, a cleaning unit 230, and a determining unit 240.

The stripe configuring unit 210 may configure a stripe based on a physical page number of pages included in the memory channels. The parity generating unit 220 may generate parity data with respect to the configured stripe.

When multiple page data write requests are sequentially received, the control device 100 may perform the multichannel interleaving to independently perform sequential write operations on a clean page of the memory channels in a logical block address.

The cleaning unit 230 may perform data cleaning by generating a cleaning block including stripes and selecting a cleaning block having a fewest number of valid pages as a target block for the data cleaning from among cleaning blocks. Also, the cleaning unit 230 may perform the data cleaning on the selected target block for the data cleaning.

Further, the cleaning unit 230 may copy the target block into at least a portion of blocks of multiple chips associated with the multichannel interleaving and perform the data cleaning on the target block for the data cleaning.

The determining unit 240 may determine whether a first critical time elapses after a most recently requested first page write request is processed.

When the first critical time elapses after the first page write request is processed, the parity generating unit 220 may generate a partial parity with respect to a first physical page number associated with the first page write request.

When the first critical time elapses after the first page write request is processed, and a ratio of clean pages to the first physical page number is greater than or equal to a threshold, the parity generating unit 220 may generate the partial parity. Here, the first critical time and the threshold of the ratio may be predefined by a user of the control device 100.

When a second critical time greater than the first critical time elapses after the first page write request is processed, although the ratio of clean pages to the first physical page number is less than the threshold, the parity generating unit 220 may generate the partial parity. The control device 100 may determine that a possibility of page data loss or error is greater than a possibility of generating a full parity with respect to a stripe and thus, may unconditionally write the partial parity subsequent to a last write operation although a small number of clean pages remains, for example, less than the threshold, when the second critical time elapses.

The parity generating unit 220 may control the multichannel interleaving to write the generated partial parity in any one of the clean pages corresponding to the first physical page number.

The control device 100 may allocate at least a portion of blocks of the multiple chips associated with the multichannel interleaving as a partial parity storing area, and control the multichannel interleaving to write the partial parity data in the partial parity storing area. Hereinafter, the partial parity storing area will be further described with reference to the related figures.

Figure 3:
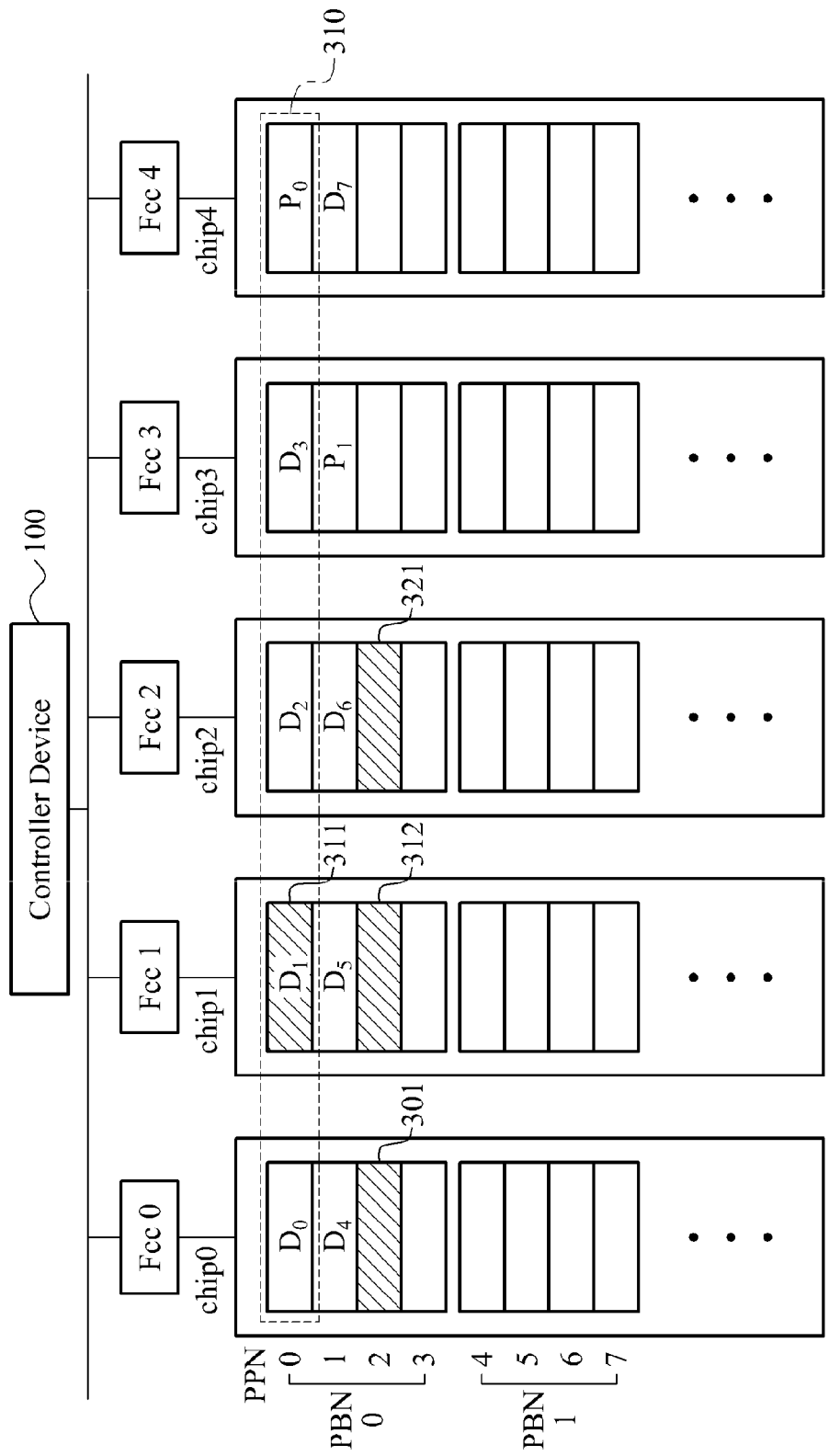
FIG. 3 is a diagram illustrating an example in which data is updated in a control device according to an embodiment of the present invention.

FIG. 3 is a diagram illustrating an example in which data is updated in the control device 100, also referred to as the controller device 100 in FIG. 3, according to an embodiment of the present invention.

The control device 100 may control communication with a host and individual components associated with a flash memory. Under the control of the control device 100, a flash chip controller (FCC) may control each flash memory chip.

Referring to FIG. 3, a storage device may include five flash memory chips, for example, chip 0, chip 1, chip 2, chip 3, and chip 4. In FIG. 3, "PPN" and "PBN" indicate a physical page number and a physical block number, respectively. The PBN may include an identical PPN in each flash memory chip.

Also, "Dx," in which "x" is 0, 1, 2, 3 . . . , indicates a logical block address (LBA) of data of a user. "Px," in which "x" is 0, 1, 2, 3 . . . , indicates a parity with respect to a stripe 310.

The stripe 310 may include pages with the identical PPN in the flash memory chips. For example, the stripe 310 may also be referred to as a dynamic stripe (DS). A conventional stripe may be managed by a stripe map table because the conventional strip is configured based on a logical address. However, the stripe 310 configured by the control device 100, for example, the DS, may not require the stripe map table because the stripe 310 is generated based on a physical address.

When a data write operation is performed on the stripe 310, at least one full parity or the partial parity may be generated with respect to the stripe 310 before the PPN page of the stripe 310 is completely filled with data in order to improve reliability of an SSD and restore the data.

FIG. 3 illustrates an example in which a data update request occurs with respect to data, for example, D1 and D2. In general, the SSD may include multiple flash memory chips, for example, 10 through 16 flash memory chips.

However, FIG. 3 illustrates only the five flash memory chips, for example, chip 0, chip 1, chip 2, chip 3, and chip 4, for convenience of description.

As illustrated in FIG. 3, the data of the user, for example, D0 through D7, may be written in PPN0 and PPN1 of the flash memory chips. Also, FIG. 3 illustrates a parity, P0, with respect to the stripe 310 including identical pages of the PPN0 and a parity, P1, with respect to a stripe including identical pages of the PPN1. As described in the foregoing, at least one stripe may include the at least one full parity.

As an example, the data, for example, D1 311 and D2, in an initial state may be updated. Here, D1' and D2' write requests may occur due to requests for updating the D1 311 and the D2 to D1' and D2'. In response to the write requests by the updating requests, the control device 100 may allow the D1' and the D2' data to be written on the identical PPN page of the flash memory chips through the interleaving based on an order of the write requests.

In related technology, a stripe may be configured based on a logical address and thus, data to be updated may need to be written on an empty page in identical flash memory chips, for example, an empty page of a flash memory chip on which data is initially written. For convenience of description, data updating performed on the D1 311, will be described first.

For example, a request for updating only the D1 311 in the initial state may occur. In related technology, the D1' to which the D1 311 is updated may be written on an empty page 312 of an initially written identical flash memory chip. However, the control device 100 may allow the D1' to be sequentially written on empty pages.

That is, the control device 100 may generate a stripe based on a physical address and thus, may not allow the D1' to be written on the empty page 312 in the identical flash memory chip.

The control device 100 may allow the D1' to be written on a page 301 next to a page of data D7 based on a most recent write request in an initial state. The control device 100 may allow a page 311 on which the D1 in the initial state is written to be an invalid page.

In general, the parity generating unit 220 may generate a full parity with respect to a stripe when at least one stripe is filled due to write requests.

However, when the data updating is performed on a portion of a stripe, the parity generating unit 220 may immediately generate a partial parity with respect to data to be updated, or data to be written by a write request, without waiting until the stripe is filled with data.

In a case of the data updating performed on the D1, which is the initial data, the stripe configuring unit 210 may configure a stripe by allowing the D1' to be written on the page 301 based on the physical address. Also, the parity generating unit 220 may immediately generate the partial parity in the page 312 next to the page 301 of the D1', rather than generating the full parity without waiting until a corresponding stripe including the D1' is filled.

For example, the D1 and D2 may be sequentially updated from the initial state as illustrated in FIG. 3. In related technology, the D1' and D2' to which the D1 and D2 are updated may be written on an empty page of identical flash memory chips initially written based on the logical address. Thus, the D1' may be written on the page 312 of the PPN2 of the chip 1, and the D2' may be written on the page 321 of the PPN2 of the chip 2.

However, the stripe configuring unit 210 may configure a stripe based on the physical address and thus, may allow the D1' and the D2' to be written on a PPN page of each flash memory chip through the interleaving based on an order of respective write requests. Thus, the stripe configuring unit 210 may allow the D1' to be written on the page 301 of the PPN2 of the chip 0, and the D2' to be written on the page 312 of the PPN2 of the chip 1. Also, when the updated data is written, pages in which the D1 and the D2 in the initial state may become invalid pages.

As described in the foregoing, when a stripe is filled due to a write request, a full parity with respect to the stripe may be generated. However, when the data updating is performed on a portion of a stripe, the parity generating unit 220 may immediately generate a partial parity with respect to updated data, or data to be written by a write request, without waiting unit the stripe is filled with data.

For example, the data updating is to be performed on the D1 and the D2 in the initial state, the D1' and the D2' to which the D1 and the D2 are updated may be written on the page 301 and the page 312, respectively, based on the physical address. Also, the partial parity with respect to the D1' and the D2' may be generated in the page 321 next to lastly most recently updated page 312, without waiting until the stripe including the D1' and the D2' is filled.

The control device 100 may dynamically configure a stripe only for data to which a write request is made, and generate a parity, or a full parity, with respect to the stripe. Accordingly, the control device 100 may not require an additional read operation on initially written data to generate a parity with respect to updated data and thus, a parity write number may decrease. Further, a phenomenon in which write operations are focused on a flash memory chip may be eliminated and thus, an issue of a diminished service life of the flash memory chip may be alleviated.

For another example, another write request for data D8 occurs after the data updating to the D1' and the D2' is performed and the partial parity with respect to the updated D1' and the D2 is generated, the D8 may be written on an empty page of the PPN2 of the chip 3. Also, a new full parity with respect to all stripes corresponding to a last page, for example, the PPN2 page of the chip 4, may be generated.

Here, the D8 stored in a write buffer of the SSD may be used and thus, a read operation may not be required to generate the full parity. As described, a parity generated by a write request smaller than a size of a stripe may be referred to as a partial parity, through which reliability of the SSD may be ensured without an additional hardware, for example, a non-volatile random-access memory (NVRAM).

For still another example, the determining unit 240 may determine whether a partial parity is generated based on a critical time elapsed from a most recently processed write request. When the requests for the data updating to the D1' and the D2' are made, and the D1' and the D2' are to be written on the PPN2 page of the chip 0 and the PPN2 page of the chip 1, respectively, the parity generating unit 220 may wait for a first critical time until another write request is received without immediately generating the partial parity.

When another write request is received within the first critical time, a stripe may be configured based on an order of write requests. When the stripe is filled due to another write request, the parity generating unit 220 may immediately generate a full parity corresponding to all stripes without generating a partial parity.

Conversely, when another write request is not received within the first critical time, for example, when a stripe is not filled and further write request is not received, the parity generating unit 220 may immediately generate a partial parity in a page next to a page written by a most recent write request and thus, reliability of the storage device may be improved.

The determining unit 240 may determine whether a partial parity is generated based on the critical time and a ratio of clean pages to entire pages.

As described in the foregoing, when the requests for the data updating to the D1' and the D2' are made and the D1' and the D2' are to be written on the PPN2 page of the chip 0 and the PPN2 page of the chip 1, respectively, the parity generating unit 220 may wait for the first critical time until another write request is received without immediately generating a partial parity.

When another write request is received within the first critical time, a stripe may be configured based on an order of write requests. Also, when the stripe is filled due to another write request, the parity generating unit 220 may immediately generate a full parity corresponding to entire stripe without generating a partial parity.

Conversely, when another write request is not received within the first critical time, for example, when a stripe is not filled and further write request is not received, the determining unit 240 may determine whether a sufficient number of clean pages are is present within the stripe.

For example, when the determining unit 240 determines that a ratio of clean pages to entire pages in a stripe in which data is to be written by a write request is greater than or equal to a predefined threshold, the determining unit 240 may determine that an available page is present in the stripe.

Also, when the determining unit 240 determines that the ratio of the clean pages is less than the predefined threshold, the determining unit 240 may determine that the available page is not present in the stripe and thus, may wait for a second critical time greater than the first critical time for another write request.

When another write request is not received despite a lapse of the second critical time, the determining unit 240 may allow the partial parity corresponding to the stripe to be generated, although the ratio of the clean pages is less than the predefined threshold.

Figure 4:
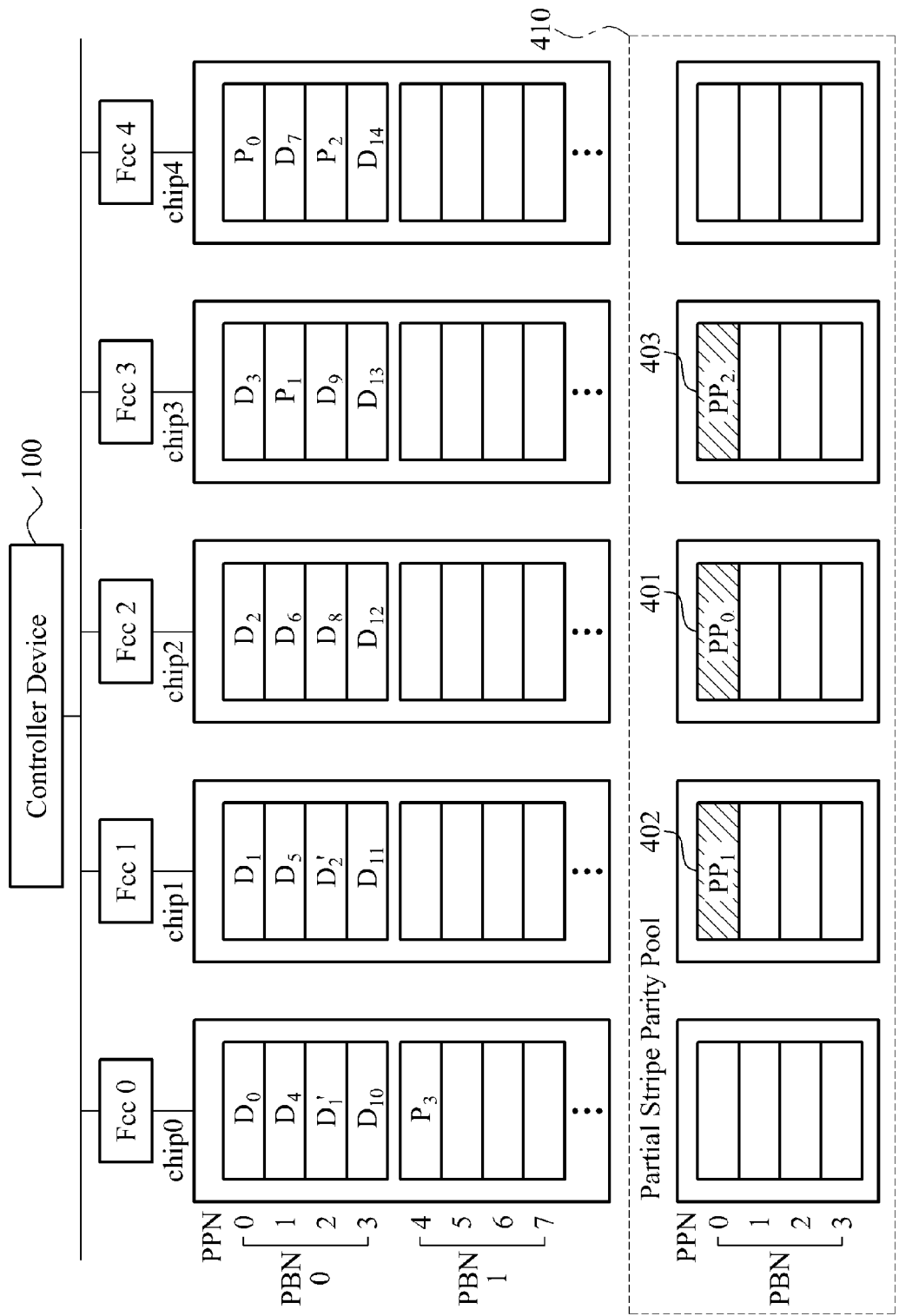
FIG. 4 is a diagram illustrating a partial stripe parity pool in which a partial parity may be generated in a control device according to an embodiment of the present invention.

FIG. 4 is a diagram illustrating a partial stripe parity pool 410 in which a partial parity may be generated in the control device 100, also referred to as the controller device 100 in FIG. 4, according to an embodiment of the present invention. The control device 100 may allocate at least a portion of blocks of multiple chips associated with multichannel interleaving as a partial parity storing area, for example, the partial stripe parity pool 410, and control the multichannel interleaving to allow partial parity data to be written in the partial stripe parity pool 410.

As illustrated in FIG. 3, when the D1' and the D2' are written on the page 301 and the page 312, respectively, based on a physical address, or on a critical time and a ratio of clean pages as the case may be, the partial parity may be recorded in the next page 321. Subsequently, when another write request, for example, a write request for the D8, occurs, the D8 may be written on a next page, for example, the PPN2 page of the chip 3, and the full parity may be recorded in a last page, for example, the PPN2 page of the chip 4, because a parity with respect to entire stripe is required to be recorded.

However, referring to FIG. 4, a write operation may be performed in response to a subsequent write request without recording the full parity with respect to the entire stripe, and the partial parity may be separately recorded in the partial stripe parity pool 410.

Although write requests for D8 and D9 are made in succession subsequent to the data updating to the D1' and the D2', "P2" may required to be recorded because at least one parity is required to be recorded in at least one stripe. Subsequently, when a write request for D10 is received, the D10 may be written on page 3 of chip 0, and a partial parity PP1 402 with respect to the written D10 may be recorded in chip 1 of the partial stripe parity pool 410.

When subsequent write requests for D11, D12, D13, and D14 are sequentially received, the data may be sequentially written on the chip 1, chip 2, chip 3, and the chip 4, and a full parity P3 may be recorded in PPN 4 of the chip 0. The D11 through the D14 may be considered a single stripe and thus, the full parity P3 may be written.

When a stripe is completely filled, at least one full parity may be recorded in the stripe. Conversely, when a stripe is not filled, a partial parity may be separately recorded in the partial stripe parity pool 410. A reason for the recording of partial parities, for example, PP0 401, the PP1 402, and PP2 403, in the partial stripe parity pool 410, may be that data included in a single stripe may need to be distributed to different chips and thus, the data may be restored when an error occurs in a chip using the distributed data based on characteristics of a RAID method.

At least one partial parity or full parity may be maintained per the number of pages, for example, five in FIGS. 3 and 4, configuring a stripe.

Using the parity storing area, for example, the partial stripe parity pool 410, may enable a reduction in the number of parities maintained for each page configuring a stripe and recovery of data from an error that may occur in a chip.

Figure 5:
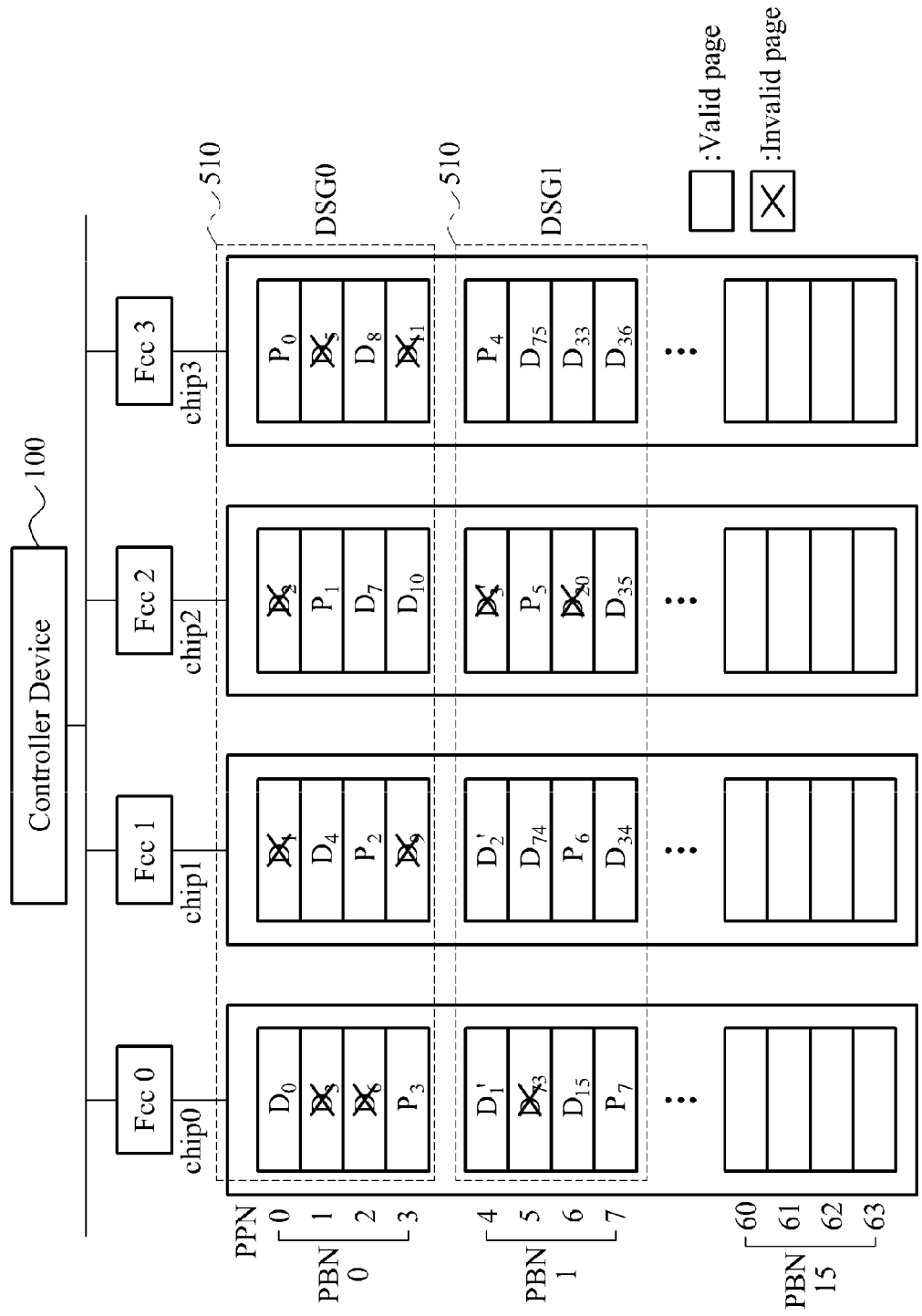
FIG. 5 is a conceptual diagram illustrating an example prior to data cleaning in a control device according to an embodiment of the present invention.

FIG. 5 is a conceptual diagram illustrating an example prior to data cleaning in the control device 100 according to an embodiment of the present invention.

Figure 6:
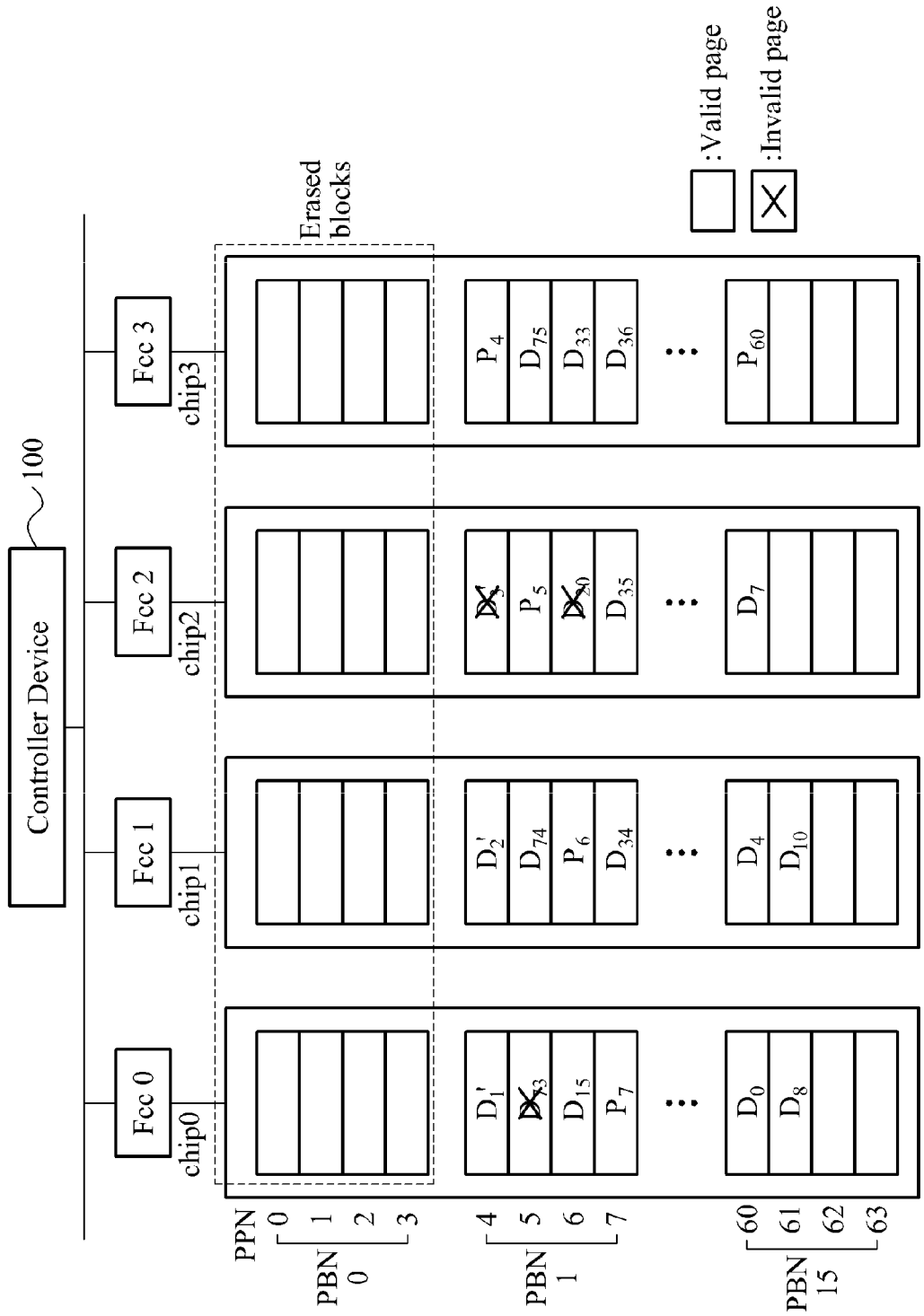
FIG. 6 is a conceptual diagram illustrating an example subsequent to data cleaning in a control device according to an embodiment of the present invention.

A cleaning operation for a flash memory chip may be performed by a unit of blocks. Thus, blocks including a stripe may need to be simultaneously cleaned to generate an available space. As illustrated in FIGS. 5 and 6, the blocks including the stripe, for example, a dynamic stripe (DS), may be referred to as a dynamic stripe group (DSG).

A group of blocks, or a DSG, having a fewest number of valid pages may be selected as a target block for the cleaning operation. Referring to FIG. 5, the number of valid pages of DSG0 is five, and the number of valid pages of DSG1 is nine.

Thus, the DSG0 may be selected as the target block for the cleaning operation because the number of the valid pages of the DSG0 is less than the number of the valid pages of the DSG1.

FIG. 6 is a conceptual diagram illustrating an example subsequent to data cleaning performed by the cleaning unit 230 of the control device 100 according to an embodiment of the present invention. In the example illustrated in FIG. 5, the cleaning operation may be performed by selecting the DSG0 having the fewest number of valid pages.

The cleaning unit 230 may copy data, for example, D0, D4, and D7, in valid pages of the DSG 0 on which the cleaning operation is to be performed into PPN 60 page of chip 0, chip 1, and chip 2, respectively.

The control device 100 may configure a new stripe, for example, a dynamic stripe, by generating a full parity P60 with respect to the D0, the D4, and the D7 to be copied and recording the P60 in the PPN 60 of chip 3. Also, D8 and D10 in remaining valid pages may be written in a next stripe and a partial parity may be generated.

According to an embodiment, an available space may be secured for a stripe by simultaneously performing the cleaning operation in all flash memory chips. The flash memory chips may perform the cleaning operation in parallel and thus, the cleaning operation may be similar to a cleaning operation performed on a single flash memory chip.

To ensure data consistency, the cleaning operation may be performed in accordance with the following order. 1) All valid pages in target blocks for the cleaning operation may be copied to an available page. 2) A stripe may be dynamically configured during operation 1) and a parity write operation may be completed. 3) The target blocks for the cleaning operation may be erased.

Through the order, data may be restored using existing data in the target blocks for the cleaning operation despite occurrence of an error during the parity write operation of 2).

Figure 7:
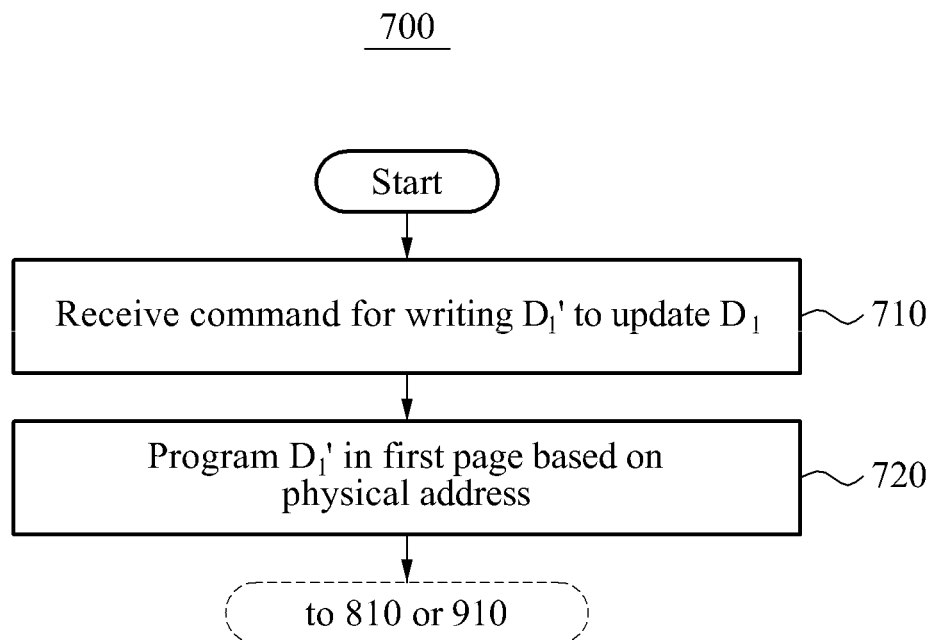
FIG. 7 is a flowchart illustrating a control method of managing multiple memory channels driven through multichannel interleaving in a control device according to an embodiment of the present invention.

FIG. 7 is a flowchart illustrating a control method 700 of managing multiple memory channels driven through multi-channel interleaving in a control device according to an embodiment of the present invention.

In operation 710, the control device may receive a command for a data update request with respect to an initial data D1. In operation 720, a stripe may be configured by programming, in a first page, data D1' to which the D1 is updated based on a physical page number of pages included in the multiple memory channels. Also, the control device may generate parity data with respect to the configured stripe.

Figure 8:
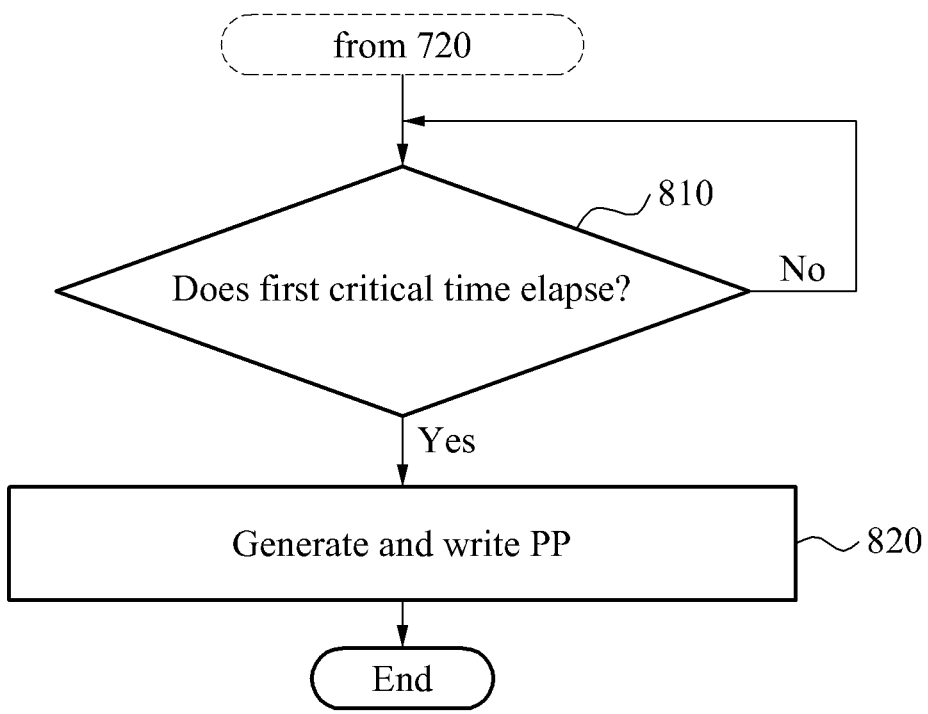
FIG. 8 is a flowchart illustrating a control method based on a critical time according to an embodiment of the present invention.

FIG. 8 is a flowchart illustrating a control method based on a critical time according to an embodiment of the present invention. The critical time may be applied to the control method described with reference to FIG. 7 to determine whether a partial parity is generated.

In operation 810, the determining unit 240 of FIG. 2 may determine whether a first critical time elapses after a most recently processed data is programmed in a first page, subsequent to operation 720 in which a stripe is configured by programming, in the first page, the data D1' based on the physical page number of the pages included in the multiple memory channels.

In operation 820, when the first critical time elapses after a first page write request is processed, partial parity data with respect to a first physical page number associated with the first page write request may be generated.

Figure 9:
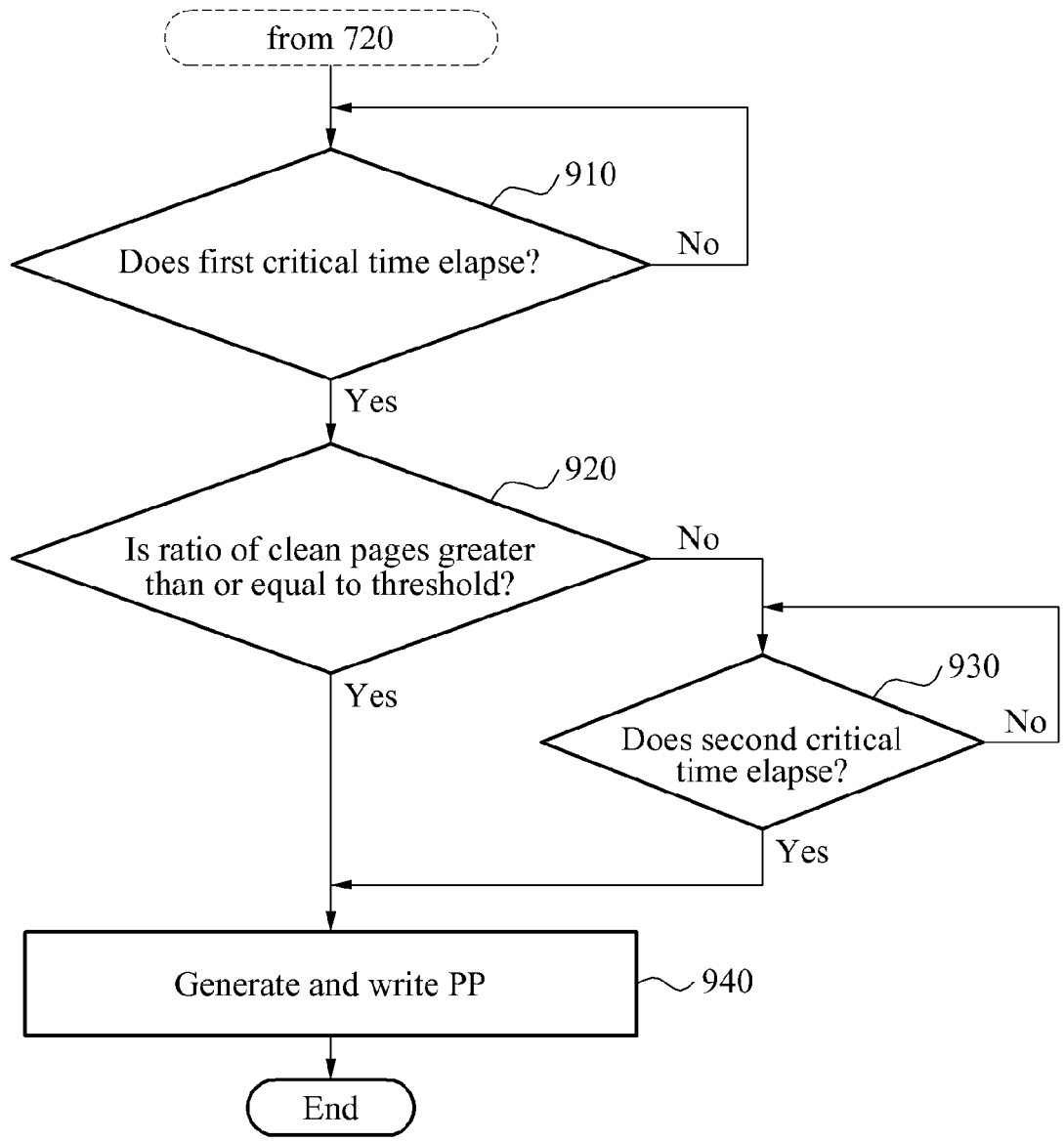
FIG. 9 is a flowchart illustrating a control method based on a critical time and a ratio of clean pages of a stripe according to an embodiment of the present invention.

FIG. 9 is a flowchart illustrating a control method based on a critical time and a ratio of clean pages to entire pages of a stripe according to an embodiment of the present invention.

In operation 910, the determining unit 240 of FIG. 2 may determine whether a first critical time elapsed after a first page write request is processed.

The determining unit 240 may determine whether the first critical time elapses after the first page write request is processed. In operation 920, when the first critical time elapses after the first page write request is processed, the determining unit 240 may determine whether the ratio of clean pages to a first physical page number is greater than or equal to a threshold. In operation 940, when the ratio of clean page is greater than or equal to the threshold, the control device 200 may generate and record a partial parity (PP).

In operation 930, when the first critical time elapses after the first page write request is processed, and the ratio of clean pages is less than the threshold, the determining unit 240 may determine whether a second critical time greater than the first critical time elapses.

In operation 940, when the second critical time greater than the first critical time elapses after the first page write request is processed, the determining unit 240 may allow the parity generating unit 220 to generate the partial parity despite the ratio of clean pages being less than the threshold.

Figure 10:
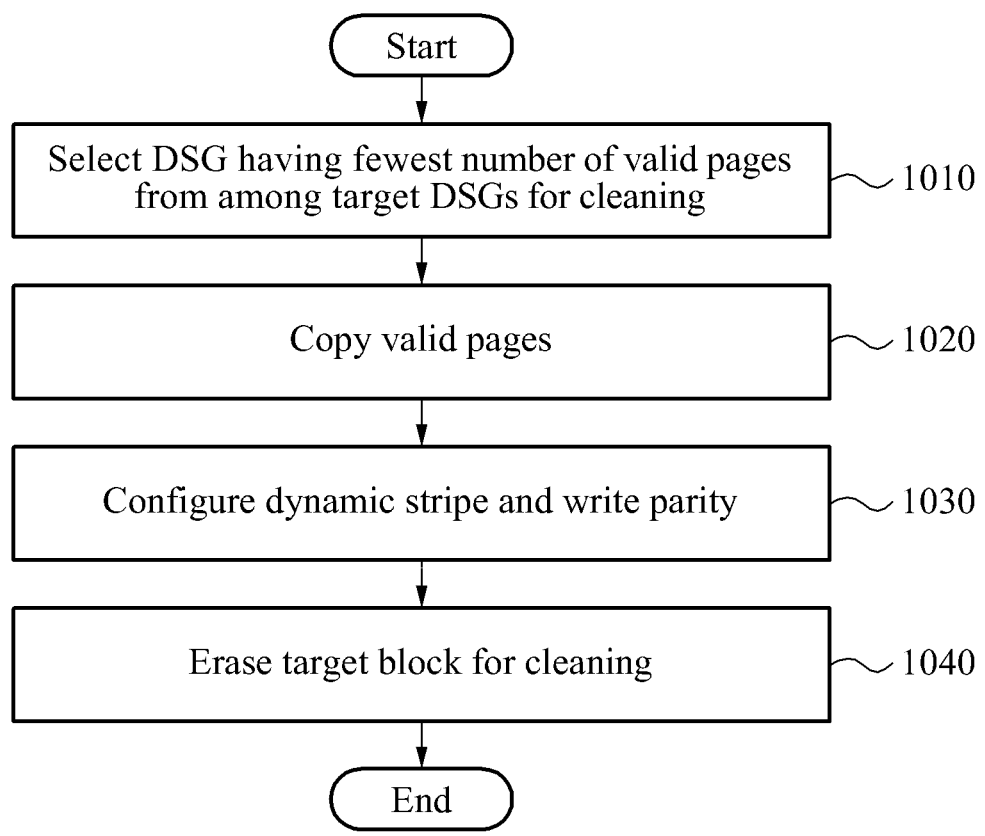
FIG. 10 is a flowchart illustrating data cleaning by a control device according to an embodiment of the present invention.

FIG. 10 is a flowchart illustrating data cleaning performed by a control device according to an embodiment of the present invention. Referring to FIG. 10, the control device may dynamically generate a stripe based on an order in which write requests occur and thus, may reduce a parity updating cost.

According to an embodiment, to interleave data in a flash memory chip based on an order of write requests, allocating the data to the flash memory chip based on an identical PPN of each flash memory chip may be a desirable method to manage a flash memory.

A stripe in the control device may be configured with identical PPN pages of flash memory chips. To configure the stripe by the stripe configuring unit 210, the identical PPN pages of the flash memory chips may need to be secured as an available space and the cleaning operation may require the available space.

The cleaning unit 230 may perform the cleaning operation on each block of the flash memory. Also, to generate space required for the strip, blocks including the stripe may need to be simultaneously cleaned. As described in the foregoing, the blocks including the stripe may be referred to as a dynamic stripe group (DSG).

To secure a space for the stripe, the cleaning operation may need to be simultaneously performed on all flash memory chips. The flash memory chips may perform the cleaning operation in parallel and thus, a cost similar to a cost for the cleaning operation performed on a single chip may be involved.

To ensure data consistency, the cleaning operation may be performed based on the following order.

In operation 1010, a cleaning block including stripes may be generated, and a cleaning block having a fewest number of valid pages among cleaning blocks may be selected as a target block for the cleaning operation.

In operation 1020, all valid pages in the target blocks may be copied to an available page. In operation 1030 concurrent with operation 1020, a stripe may be dynamically configured and a parity write operation may be completed. In 1040, the target blocks for the cleaning operation may be erased.

Through the order, data may be restored using existing data in the target blocks for the cleaning operation despite the occurrence of an error during the parity write operation.

The units described herein may be implemented using hardware components and software components. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums. The non-transitory computer-readable recording medium may include any data storage device that can store data which can be thereafter read by a computer system or processing device. Examples of the non-transitory computer-readable recording medium include read-only memory (ROM), random-access memory (RAM), CD-ROMs, magnetic tapes, floppy disks, optical data storage devices. Also, functional programs, codes, and code segments that accomplish the examples disclosed herein can be easily construed by programmers skilled in the art to which the examples pertain based on and using the flow diagrams and block diagrams of the figures and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

The invention claimed is:

1. A hardware controller device for managing multiple non-transitory memory channels driven through multichannel interleaving, the device comprising:
   a stripe configuring unit to configure a stripe based on a physical page number of pages comprised in the memory channels;
   a parity generating unit to generate parity data with respect to the configured stripe; and
   a determining unit to determine whether a first critical time elapses after a most recently requested first page write request is processed,
   wherein, when the first critical time elapses after the first page write request is processed, the parity generating unit generates partial parity data with respect to a first physical page number associated with the first page write request.

2. The device of claim 1, wherein, when multiple data write requests are sequentially received, the controller device performs the multichannel interleaving to independently perform sequential write operations on a clean page of the memory channels to a logical block address.

3. The device of claim 1, further comprising:
   a cleaning unit to perform data cleaning on data written on the pages by generating a cleaning block comprising a stripe and selecting a cleaning block having a fewest number of valid pages as a target block for the data cleaning from among cleaning blocks,
   wherein the cleaning unit copies the target block into at least a portion of blocks of multiple chips associated with the multichannel interleaving, and performs the data cleaning on the target block.

4. The device of claim 1, wherein, when the first critical time elapses after the first page write request is processed and a ratio of clean pages to the first physical page number is greater than or equal to a threshold, the parity generating unit generates the partial parity data.

5. The device of claim 4, wherein, when a second critical time greater than the first critical time elapses after the first page write request is processed, and the ratio of clean pages to the first physical page number is less than the threshold, the parity generating unit generates the partial parity data.

6. The device of claim 1, wherein the controller device controls the multichannel interleaving to allow the generated partial parity data to be written on any one of clean pages corresponding to the first physical page number.

7. The device of claim 1, wherein the controller device allocates at least a portion of blocks of the multiple chips associated with the multichannel interleaving as a partial parity storing area, and controls the multichannel interleaving to allow the partial parity data to be written in the partial parity storing area.

8. A hardware controller device, comprising:
   a determining unit to determine whether a first critical time elapses after a most recently requested first page write request is processed when a page data write operation is processed through multichannel interleaving; and
   a parity generating unit to generate partial parity data with respect to a first physical page number associated with the first page write request when the first critical time elapses after the first page write request is processed.

9. The device of claim 8, wherein the parity generating unit generates the partial parity data when the first critical time elapses after the first page write request is processed and a ratio of clean pages to the first physical page number is greater than or equal to a threshold.

10. The device of claim 9, wherein, when a second critical time greater than the first critical time elapses after the first page write request is processed, and the ratio of clean pages to the first physical page number is less than the threshold, the parity generating unit generates the partial parity data.

11. A control method to manage multiple non-transitory memory channels driven through multichannel interleaving, the method comprising:
   with a hardware controller device,
      configuring a stripe based on a physical page number of pages comprised in the memory channels;
      generating parity data with respect to the configured stripe; and
      determining whether a first critical time elapses after a most recently requested first page write request is processed,
   wherein, when the first critical time elapses after the first page write request is processed, the generating of the parity data comprises generating partial parity data with respect to a first physical page number associated with the first page write request.

12. The method of claim 11, wherein, when multiple page data write requests are sequentially received, the multichannel interleaving is performed to independently perform sequential write operations on a clean page of the memory channels to a logical block address.

13. The method of claim 11, wherein, when the first critical time elapses after the first page write request is processed and a ratio of clean pages to the first physical page number is greater than or equal to a threshold, the generating of the parity data comprises generating the partial parity data, and wherein, when a second critical time greater than the first critical time elapses after the first page write request is processed, and the ratio of clean pages to the first physical page number is less than the threshold, the generating of the parity data comprises generating the partial parity data.

14. The method of claim 11, wherein the control method comprises controlling the multichannel interleaving with the controller device to allow the generated partial parity data to be written on any one of clean pages corresponding to the first physical page number.

15. The method of claim 11, wherein the control method further comprises, with the controller device, allocating at least a portion of blocks of multiple chips associated with the multichannel interleaving as a partial parity storing area, and controlling the multichannel interleaving to allow the partial parity data to be written in the partial parity storing area.

16. A control method, comprising:
with a hardware controller device,
determining whether a first critical time elapses after a most recently requested first page write request is processed when a page data write operation is processed through multichannel interleaving; and
generating partial parity data with respect to a first physical page number associated with the first page write request when the first critical time elapses after the first page write request is processed.

17. The method of claim 16, wherein, when the first critical time elapses after the first page write request is processed and a ratio of clean pages to the first physical page number is greater than or equal to a threshold, the generating of the partial parity data is performed, and wherein, when a second critical time greater than the first critical time elapses after the first page write request is processed, and the ratio of clean pages to the first physical page number is less than the threshold, the generating of the partial parity data is performed.

* * * * *